(12) United States Patent
Lee et al.

(10) Patent No.: US 11,489,134 B2
(45) Date of Patent: Nov. 1, 2022

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: YongBaek Lee, Anyang-si (KR); Ho-Jin Kim, Seoul (KR); Goeun Jung, Goyang-si (KR); Dongyoung Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 210 days.

(21) Appl. No.: 15/790,580

(22) Filed: Oct. 23, 2017

(65) Prior Publication Data

US 2018/0123074 A1 May 3, 2018

(30) Foreign Application Priority Data

Oct. 31, 2016 (KR) .......................... 10-2016-0143786

(51) Int. Cl.
*H01L 27/32* (2006.01)
*H01L 51/52* (2006.01)
*H01L 51/50* (2006.01)

(52) U.S. Cl.
CPC ........ *H01L 51/5203* (2013.01); *H01L 27/322* (2013.01); *H01L 27/323* (2013.01);
(Continued)

(58) Field of Classification Search
CPC . H01L 27/322; H01L 27/323; H01L 51/5237; H01L 51/5253; H01L 51/50;
(Continued)

(56) References Cited

U.S. PATENT DOCUMENTS

2004/0179153 A1* 9/2004 Yeh .................... G02F 1/133514
349/106
2011/0284898 A1* 11/2011 Iwasaki ............... H01L 51/5253
257/98
(Continued)

FOREIGN PATENT DOCUMENTS

CN 103412697 A 11/2013
CN 107039597 A 8/2017

OTHER PUBLICATIONS

Office Action dated May 10, 2021, issued in corresponding Chinese Patent Application No. 201710969714.7.
(Continued)

*Primary Examiner* — Monica D Harrison
*Assistant Examiner* — John Lin
(74) *Attorney, Agent, or Firm* — Morgan, Lewis & Bockius LLP

(57) ABSTRACT

An organic light-emitting display device and method of manufacturing the same are provided. An organic light-emitting display device includes: a substrate, an organic light-emitting device on the substrate, an encapsulation layer on the substrate and the organic light-emitting device, the encapsulation layer covering the organic light-emitting device, the encapsulation layer including an encapsulation hole, a black matrix covering the encapsulation layer, the black matrix including a black matrix hole over the encapsulation hole, and a color filter in the encapsulation hole and the black matrix hole.

10 Claims, 10 Drawing Sheets

(52) U.S. Cl.
CPC ...... *H01L 27/3246* (2013.01); *H01L 51/5237* (2013.01); *H01L 51/5253* (2013.01); *H01L 51/5056* (2013.01)

(58) Field of Classification Search
CPC ............. H01L 27/3246; H01L 27/3244; H01L 51/5203; H01L 51/5056; H01L 21/77; H01L 27/3272; G02F 1/136209; G02F 1/135512; G02F 1/133512
See application file for complete search history.

(56) References Cited

U.S. PATENT DOCUMENTS

| | | | | |
|---|---|---|---|---|
| 2013/0155505 A1* | 6/2013 | Kim | .................... | H04N 13/337 359/465 |
| 2014/0117324 A1* | 5/2014 | Kim | .................... | G06F 1/1652 257/40 |
| 2014/0179041 A1* | 6/2014 | Huh | .................... | H01L 51/5253 438/28 |
| 2015/0130745 A1 | 5/2015 | Choi et al. | | |
| 2015/0207045 A1* | 7/2015 | Wada | ................... | H01L 25/0753 257/88 |
| 2015/0253899 A1 | 9/2015 | Yang et al. | | |
| 2015/0349030 A1* | 12/2015 | Ono | ........................ | G02B 5/003 257/40 |
| 2016/0218319 A1* | 7/2016 | Kim | .................... | H01L 51/5256 |
| 2016/0315284 A1* | 10/2016 | Jeon | .................... | H01L 51/5246 |
| 2016/0320885 A1* | 11/2016 | Kim | .................... | G06F 3/0446 |
| 2017/0125744 A1 | 5/2017 | Kim et al. | | |

OTHER PUBLICATIONS

Office Action dated Nov. 3, 2021, issued in corresponding Chinese Patent Application No. 201710969714.7.

* cited by examiner

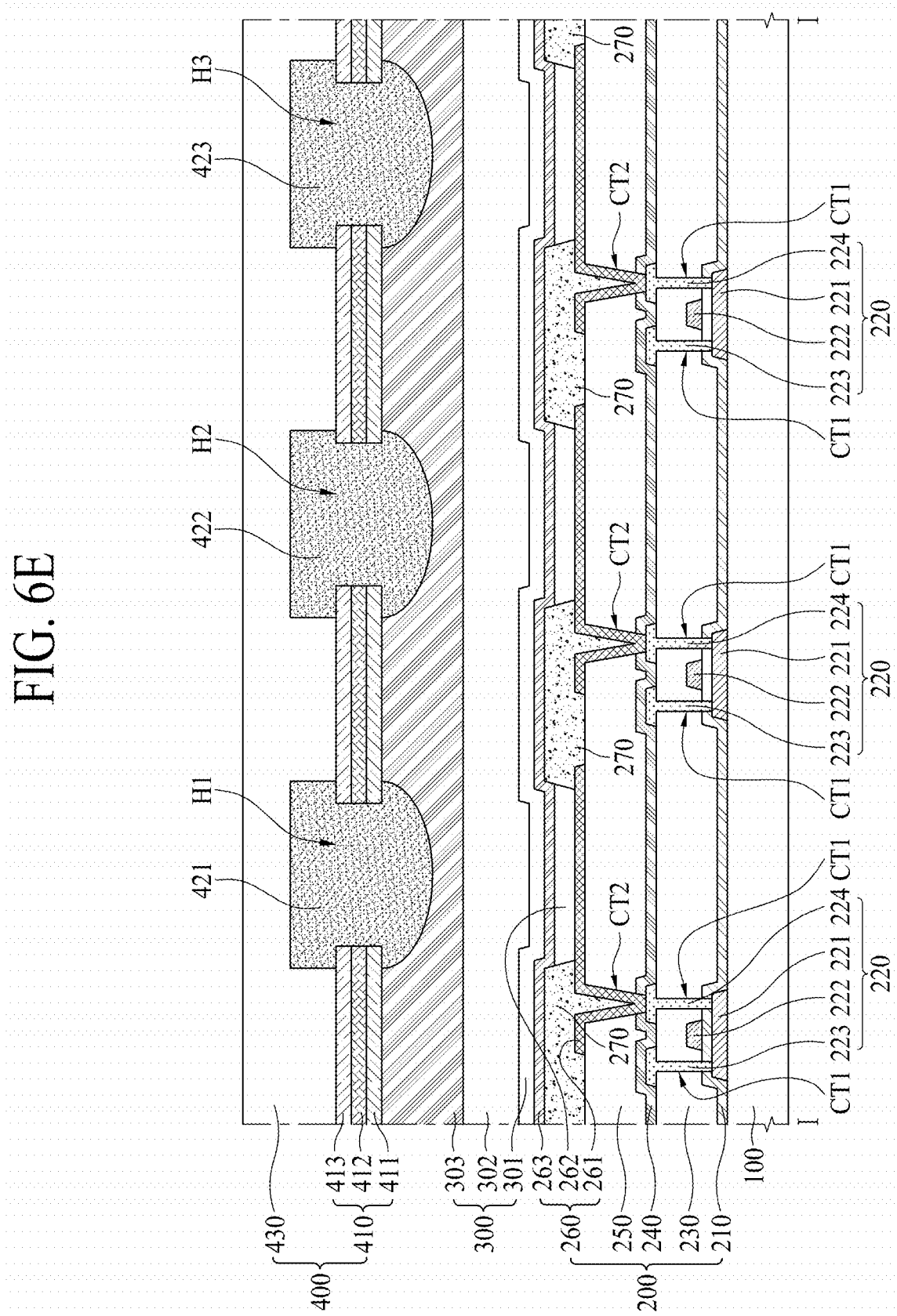

ORGANIC LIGHT-EMITTING DISPLAY DEVICE AND METHOD OF MANUFACTURING THE SAME

CROSS-REFERENCE TO RELATED APPLICATIONS

This application claims the priority of Korean Application No. 10-2016-0143786, filed on Oct. 31, 2016, the entirety of which is hereby incorporated by reference.

BACKGROUND

1. Technical Field

The present disclosure relates to an organic light-emitting display device and a method of manufacturing the same.

2. Discussion of the Related Art

With the advancement of an information-oriented society, various requirements for display devices for displaying an image are increasing. Therefore, various display devices, such as liquid crystal display (LCD) devices, plasma display panel (PDP) devices, organic light-emitting display devices, etc., are recently being used.

As a type of display device, organic light-emitting display devices are self-emitting display devices, and have better viewing angle and contrast ratio than LCD devices. Also, because the organic light-emitting display devices do not need a separate backlight, it is possible to lighten and thin the organic light-emitting display devices. Also, the organic light-emitting display devices are excellent in power consumption. Furthermore, the organic light-emitting display devices are driven with a low direct current (DC) voltage, have a fast response time, and are low in manufacturing cost.

The organic light-emitting display devices emit light using an organic light-emitting device. The organic light-emitting device may include a red organic light-emitting device emitting red light, a green organic light-emitting device emitting green light, and a blue organic light-emitting device emitting blue light, or may include only a white organic light-emitting device emitting white light. If the organic light-emitting device includes only the white organic light-emitting device, red, green, and blue color filters for respectively realizing red, green, and blue are needed. When a color filter is directly provided on the organic light-emitting device, a high temperature can affect the organic light-emitting device, and a low temperature curing color filter is used.

In the low temperature curing color filter, if a curing process is performed after an exposure process for forming the color filter, low temperature curing is performed in a state in which a dissolution rate difference occurs between a surface receiving more light and a bottom receiving relatively less light. For this reason, a cross-sectional structure has a reverse taper structure. A related art color filter formed in the reverse taper structure has a structure that is easily detached, causing the reduction in process stability and product reliability.

SUMMARY

Accordingly, the present disclosure is directed to an organic light-emitting display device and a method of manufacturing the same that substantially obviate one or more of the issues due to limitations and disadvantages of the related art.

An aspect of the present disclosure is to provide an organic light-emitting display device for reducing or preventing process stability and product reliability from being reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: a substrate, an organic light-emitting device on the substrate, an encapsulation layer on the substrate and the organic light-emitting device, the encapsulation layer covering the organic light-emitting device, the encapsulation layer including an encapsulation hole, a black matrix covering the encapsulation layer, the black matrix including a black matrix hole over the encapsulation hole, and a color filter in the encapsulation hole and the black matrix hole.

In another aspect, there is provided a method of manufacturing an organic light-emitting display device, the method including: providing a substrate, providing a thin film transistor on the substrate, providing an organic light-emitting device, electrically connected to the thin film transistor, on the substrate, covering the organic light-emitting device with an encapsulation layer, covering the encapsulation layer with a black matrix, providing a photoresist pattern on the black matrix, over-etching an upper portion of the photoresist pattern to form a hole through the black matrix and into the encapsulation layer, and removing the photoresist pattern to form a color filter in the hole.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

FIGS. 6A to 6E are cross-sectional views taken along line I-I of FIG. 1 for describing a method of manufacturing an organic light-emitting display device according to an embodiment of the present disclosure.

Figure 1:
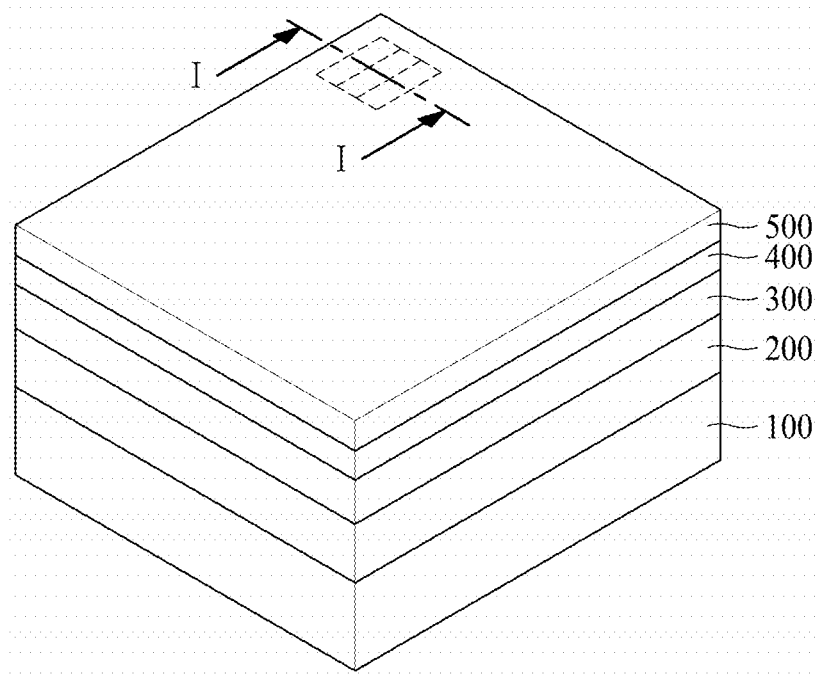
FIG. 1 is a perspective view illustrating an organic light-emitting display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

FIG. 1 is a perspective view illustrating an organic light-emitting display device according to an embodiment of the present disclosure.

With reference to the FIG. 1 example, an organic light-emitting display device according to an embodiment of the present disclosure may include a substrate 100, a pixel array layer 200, an encapsulation layer 300, a color filter layer 400, and a touch sensing layer 500. The substrate 100, which may be a base substrate, may include a plastic material, a glass material, and/or the like. The substrate 100 may include a flexible plastic material, and, for example, may include opaque or colored polyimide (PI). The substrate 100 may be manufactured, for example, by curing polyimide resin that may be coated on an upper surface of a release layer provided on a relatively thick carrier substrate to have a particular thickness. The carrier substrate may be separated from the substrate 100 by releasing the release layer, e.g., through a laser release process.

Additionally, an organic light-emitting display device according to an embodiment of the present disclosure may further include a back plate that may be coupled to a bottom of the substrate 100 with respect to a vertical axis direction (e.g., a thickness direction of the substrate 100). The back plate may maintain the substrate 100 in a planar state. The back plate may include a plastic material, for example, polyethyleneterephthalate (PET). The back plate may be laminated on the bottom of the substrate 100 separated from the carrier substrate, thereby maintaining the substrate 100 in a planar state.

The pixel array layer 200 may include a plurality of pixels P that may be provided on the substrate 100 to display an image. The plurality of pixels P may be respectively provided in a plurality of pixel areas defined by a plurality of gate lines, a plurality of data lines, and a plurality of pixel driving power lines. Each of the plurality of pixels P may be an area corresponding to a minimum unit in which actual light may be emitted, and may be defined as a subpixel. At least three adjacent pixels P may configure one unit pixel for displaying a color. For example, the one unit pixel may include a red pixel, a green pixel, and a blue pixel that may be adjacent to each other, and may further include a white pixel, e.g., for enhancing luminance.

Each of the pixels P according to an embodiment may include a pixel circuit. The pixel circuit may be provided in a circuit area defined in a corresponding pixel P, and may be connected to a gate line, a data line, and a pixel driving power line that may be adjacent thereto. The pixel circuit may control a current flowing in an organic light-emitting device according to a data signal supplied through the data line in response to a scan pulse supplied through the gate line, based on a pixel driving power supplied through the pixel driving power line. The pixel circuit according to an embodiment may include a switching thin film transistor (TFT), a driving TFT, and a capacitor.

The switching TFT and the driving TFT may each include a gate insulation layer, an active layer, a gate electrode, a source electrode, and a drain electrode. The switching TFT and the driving TFT may each be, for example, an amorphous silicon (a-Si) TFT, a poly-Si TFT, an oxide TFT, an organic TFT, or the like.

The switching TFT may include a gate electrode connected to the gate line, a first electrode connected to the data line, and a second electrode connected to a gate electrode of the driving TFT. Each of the first and second electrodes of the switching TFT may be a source electrode or a drain electrode, depending on a direction of a current. The switching TFT may be turned on by the scan pulse supplied through the gate line, and may supply the data signal, supplied through the data line, to the driving TFT.

The driving TFT may be turned on by a voltage supplied through the switching TFT and/or a voltage of the capacitor, and may control the amount of current flowing from the pixel driving power line to the organic light-emitting device. As such, the driving TFT according to an embodiment may include the gate electrode connected to the second electrode of the switching TFT, a source electrode connected to the pixel driving power line, and a drain electrode connected to the organic light-emitting device. The driving TFT may control a data current flowing from the pixel driving power line to the organic light-emitting device, based on the data signal supplied through the switching TFT, thereby allowing the organic light-emitting device to emit light having brightness proportional to the data signal.

The capacitor may be provided in an overlap area between the gate electrode and the source electrode of the driving TFT. The capacitor may store a voltage corresponding to the data signal supplied to the gate electrode, and may turn on the driving TFT with the stored voltage.

In addition, an organic light-emitting display device according to an embodiment of the present disclosure may further include a scan driving circuit that may be provided in a non-display area of the substrate 100. The scan driving circuit may generate the scan pulse according to a gate control signal input thereto, and may supply the scan pulse to the gate line. The scan driving circuit according to an embodiment may be provided in an arbitrary non-display area, enabling the scan pulse to be supplied to the gate line, of the non-display area provided on the substrate 100 along with a TFT of the pixel.

The encapsulation layer 300 may be formed to cover the pixel array layer 200, e.g., for reducing or preventing penetration of water from each pixel P to protect the organic light-emitting device that may be vulnerable to external water or oxygen. That is, the encapsulation layer 300 may be provided on the substrate 100 to cover the below-described second electrode. The encapsulation layer 300 may be formed of an inorganic material layer or an organic material layer, or may be formed in a multi-layer structure, for example, in which an inorganic material layer and an organic material layer may be alternately stacked.

The color filter layer 400 may be disposed on the encapsulation layer 300, and may convert a color of white light emitted from the pixel P. The color filter layer 400 may be directly provided on the pixel array layer 200 and the encapsulation layer 300. Thus, the color filter layer 400 may be formed through a low temperature process.

The touch sensing layer 500 may be directly provided on the color filter layer 400 of the organic light-emitting display panel, for sensing a position of a user touch. That is, the touch sensing layer 500 may not be separately manufactured, and may not be indirectly coupled to an upper surface of the color filter layer 400 by a separate optical adhesive. The touch sensing layer 500 may be directly formed on the color filter layer 400.

Figure 2:
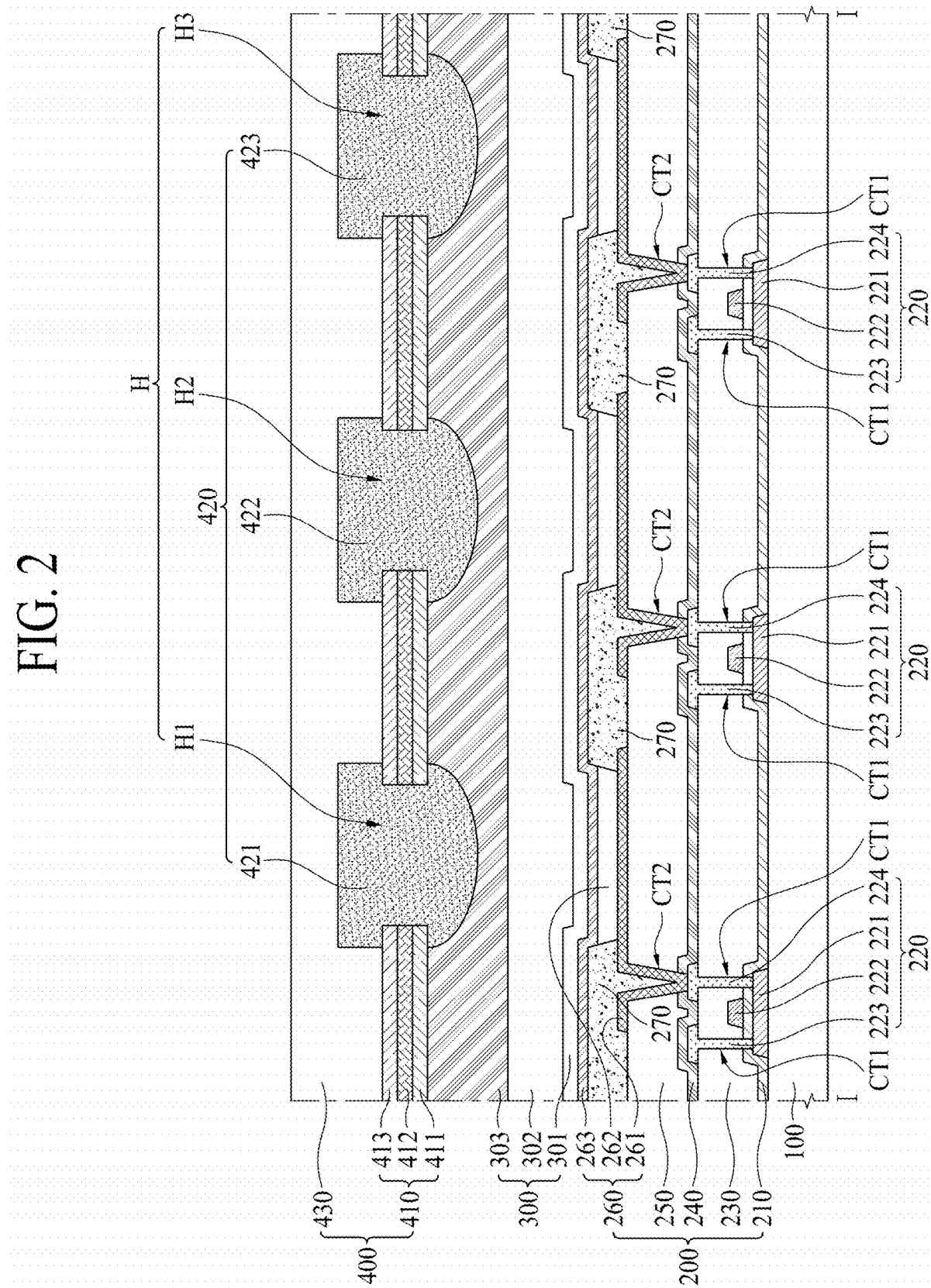
FIG. 2 is a cross-sectional view taken along line I-I of FIG. 1 and illustrates a substrate, a pixel array layer, a color filter layer, and an encapsulation layer according to an embodiment of the present disclosure.

FIG. 2 is a cross-sectional view taken along line I-I of FIG. 1 and illustrates a substrate, a pixel array layer, a color filter layer, and an encapsulation layer according to an embodiment of the present disclosure.

With reference to the FIG. 2 example, a pixel array layer 200 according to an embodiment of the present disclosure may include a gate insulation layer 210, a TFT 220, an interlayer dielectric 230, a passivation layer 240, a pixel planarization layer 250, an organic light-emitting device 260, and a bank 270. The TFT 220 may include an active layer 221, a gate electrode 222, a source electrode 223, and a drain electrode 224.

The active layer 221 may be disposed on the substrate 100. The active layer 221 may be formed, e.g., of a silicon-based semiconductor material or an oxide-based semiconductor material. A light blocking layer for blocking external light incident on the active layer 221 and a buffer layer for protecting the TFT 220 and the organic light-emitting device 260 from water may be additionally provided under the active layer 221.

The gate insulation layer 210 may be formed on the active layer 221. The gate insulation layer 220 may be formed, e.g., of an inorganic layer, for example, silicon oxide (SiO$_x$), silicon nitride (SiN$_x$), or a multilayer thereof. The gate electrode 222 may be disposed on the gate insulation layer 210. A gate line may be formed on the gate insulation layer 210. The gate electrode 222 and the gate line may each be formed, for example, of a single layer or a multilayer that may include one or more of: molybdenum (Mo), aluminum (Al), chromium (Cr), gold (Au), titanium (Ti), nickel (Ni), neodymium (Nd), and copper (Cu), and an alloy thereof.

The interlayer dielectric 230 may be formed on the gate electrode 222. The interlayer dielectric 230 may be formed of an inorganic layer, for example, SiO$_x$, SiN$_x$, or a multilayer thereof.

The source electrode 223 and the drain electrode 224 may be disposed on the interlayer dielectric 230. A data line may be disposed on the interlayer dielectric 230. The source electrode 223 may contact the active layer 221, e.g., through a contact hole CT1 that may pass through the gate insulation layer 210 and the interlayer dielectric 230. The drain electrode 224 may contact the active layer 221, e.g., through another contact hole CT1 that may pass through the gate insulation layer 210 and the interlayer dielectric 230. The source electrode 223, the drain electrode 224, and the data line may each be formed, e.g., of a single layer or a multilayer which may include, for example, one or more of: Mo, Al, Cr, Au, Ti, Ni, Nd, and Cu, and an alloy thereof.

In FIG. 2, the TFT 220 is illustrated as having a top-gate type in which the gate electrode 222 is disposed on the active layer 221, but embodiments are not limited thereto. For example, the TFT 220 may be formed as a bottom-gate type in which the gate electrode 222 is disposed under the active layer 221, or a double-gate type in which the gate electrode 222 is disposed both on and under the active layer 221.

The passivation layer 240 may be disposed on the source electrode 223, the drain electrode 224, and the data line. The passivation layer 240 may insulate the TFT 220. The passivation layer 240 may be formed, for example, of an inorganic layer, for example, SiO$_x$, SiN$_x$, or a multilayer thereof.

The pixel planarization layer 250 may be formed on the passivation layer 240. The pixel planarization layer 250 may planarize a step height caused by the TFT 220 on the passivation layer 240. The pixel planarization layer 250 may be formed, for example, of an organic layer, such as acryl resin, epoxy resin, phenolic resin, polyamide resin, polyimide resin, and/or the like.

The organic light-emitting device 260 and the bank 270 may be disposed on the pixel planarization layer 250. The organic light-emitting device 260 may include a first electrode 261, an organic light-emitting layer 262, and a second electrode 263. The first electrode 261 may be an anode electrode. The second electrode 263 may be a cathode electrode.

The first electrode 261 may be disposed on the pixel planarization layer 250. The first electrode 261 may be connected to the drain electrode 224 of the TFT 220, e.g., through a contact hole CT2 that may pass through the passivation layer 240 and the pixel planarization layer 250. The first electrode 261 may be formed, e.g., of a conductive material, which may be high in reflectance, such as a stacked structure (Ti/Al/Ti) of Al and Ti, a stacked structure (ITO/Al/ITO) of Al and indium tin oxide (ITO), an APC alloy, a stacked structure (ITO/APC/ITO) of an APC alloy and ITO, and/or the like. The APC alloy may be an alloy of silver (Ag), palladium (Pd), and Cu. Embodiments are not limited to these examples.

The bank 270 may be disposed on the pixel planarization layer 250 to overlap the first electrode 261. The bank 270 may be disposed on the first electrode 261 in the contact hole CT2. An emissive area of the pixel may be defined as an area in which the first electrode 261, the organic light-emitting layer 262, and the second electrode 263 may be sequentially stacked to emit a particular light. For example, the first electrode 261, the organic light-emitting layer 262, and the second electrode 263 may be sequentially stacked in an area in which the bank 270 is not provided. Therefore, the bank 270 may divide the emissive area, and may define the emissive area.

The organic light-emitting layer 262 may be disposed on the first electrode 261. The organic light-emitting layer 262 may be a white light-emitting layer that may emit white light. For example, the organic light-emitting layer 262 may be formed in a tandem structure of two or more stacks. Each of the stacks may include a hole transporting layer, at least one light-emitting layer, and an electron transporting layer. The organic light-emitting layer 262 may be formed, for example, in a deposition process or a solution process. When formed in the deposition process, the organic light-emitting layer 262 may be formed in an evaporation process.

The second electrode 263 may be disposed on the organic light-emitting layer 262. The second electrode 263 may be disposed on the bank 270. The second electrode 263 may be formed, for example, of a transparent conductive material (TCO), such as indium tin oxide (ITO) or indium zinc oxide (IZO), capable of transmitting light, or a semi-transmissive conductive material, such as Mg, Ag, or an alloy of Mg and Ag. A capping layer may be disposed on the second electrode 263. The second electrode 263 may be formed, for example, through a physical vapor deposition (PVD) process, such as a sputtering process.

The encapsulation layer 300 may be disposed on the second electrode 263. The encapsulation layer 300 may reduce or prevent oxygen or water from penetrating into the organic light-emitting layer 262 and the second electrode 263. As such, the encapsulation layer 300 may include at least one inorganic layer and at least one organic layer. The encapsulation layer 300 may be formed, for example, through a physical vapor deposition (PVD) process, such as a sputtering process.

The encapsulation layer 300 may include a first inorganic layer 301, an organic layer 302, and a second inorganic layer 303. For example, the first inorganic layer 301 may be disposed on the second electrode 263 to cover the second electrode 263. The organic layer 302 may be disposed on the first inorganic layer 301 to cover the first inorganic layer 301. To reduce or prevent particles from penetrating into the organic light-emitting layer 262 and the second electrode 263 via the first inorganic layer 301, the organic layer 302 may have a sufficient thickness in consideration of reducing or preventing the penetration of the particles. The second inorganic layer 303 may be disposed on the organic layer 302 to cover the organic layer 302.

The first inorganic layer 301 may be disposed closest to the organic light-emitting device 260, and may be formed, e.g., of an inorganic insulating material, which may be capable of being deposited at a low temperature, such as nitride silicon ($SiN_x$), oxide silicon ($SiO_x$), oxynitride silicon (SiON), oxide aluminum ($Al_2O_3$), and/or the like. For example, because the organic light-emitting layer 262 has a characteristic that may be vulnerable to a high temperature, the first inorganic layer 301 may be formed by a low temperature process using a low temperature atmosphere, for example, 100° (degrees) C. or less. Accordingly, the organic light-emitting layer 260 may be prevented from being damaged (or may reduce damage) by a high temperature atmosphere applied to a process chamber when forming the first inorganic layer 301.

The organic layer 302 may be provided on the substrate 100 to cover a whole upper surface of the first inorganic layer 301. The organic layer 302 may relax a stress between layers caused by bending of the organic light-emitting display device. The organic layer 302 may include, for example, an organic material, such as benzocyclobutadiene (BCB), acryl, polyimide, silicon oxycarbon (SiOC), and/or the like.

The second inorganic layer 303 may be provided on the substrate 100 to cover a whole upper surface of the organic layer 302. The second inorganic layer 303 may primarily reduce or prevent water or oxygen from penetrating into the organic layer 302 and the first inorganic layer 301 from the outside of the organic light-emitting display device. The second inorganic layer 303 may be formed, e.g., of an inorganic insulating material, which may be capable of being deposited at a low temperature, such as nitride silicon ($SiN_x$), oxide silicon ($SiO_x$), oxynitride silicon (SiON), oxide aluminum ($Al_2O_3$), and/or the like.

A hole H (e.g., holes H1, H2, H3) may be provided in the second inorganic layer 303. In a process of forming the hole H for providing a color filter 420 in a black matrix 410, if an etching process is continuously performed even after the black matrix 410 is removed, over-etching may be performed. Thus, a portion of the second inorganic layer 303 may be removed. The hole H may be provided in the black matrix 410 to extend to a lower surface of the black matrix 410.

The color filter layer 400 may be disposed on the encapsulation layer 300, and may convert a color of white light emitted from a pixel P. The color filter layer 400 according to an embodiment may include the black matrix 410 for reducing or preventing color mixture, a color filter 420 having one or more colors (e.g., color filters 421, 422, 423), and a filter planarization layer 430 for planarizing an upper surface of the color filter 420.

The black matrix 410 may be disposed on the encapsulation layer 300 to cover the encapsulation layer 300. The black matrix 410 may be disposed in a boundary between adjacent pixels P to overlap the bank 270. The black matrix 410 may reduce or prevent light emitted from each of a plurality of pixels P from being leaked to an adjacent pixel P, and may enable each pixel P to realize a gray level. The hole H may be provided in the black matrix 410 to pass through the black matrix 410. The color filter 420 overlapping the organic light-emitting layer 262 may be disposed in the hole H.

The black matrix 410 may include a plurality of metal layers. Therefore, the black matrix 410 may act as a frame when forming the color filter 420, thereby reducing or preventing deformation of a shape of the color filter 420. The black matrix 410 according to an embodiment may include a reflective layer 411, a light path change layer 412, and a semi-transmissive layer 413.

The reflective layer 411 may be directly disposed on an upper surface of the encapsulation layer 300. The reflective layer 411 according to an embodiment may include, for example, MoTi or Mo.

The light path change layer 412 may be disposed on the reflective layer 411. The light path change layer 412 may include, for example, ITO or IZO. The light path change layer 412 may include, e.g., $SiO_2$, $SiN_x$, $Al_2O_3$, and/or the like. The light path change layer 412 may be disposed between the reflective layer 411 and the semi-transmissive layer 413, e.g., to cause destructive interference based on a light path difference.

The semi-transmissive layer 413 may be disposed on the light path change layer 412. The semi-transmissive layer 413 may include MoTi or Mo. The semi-transmissive layer 413 may be formed of the same material as that of the reflective layer 411.

The color filter 420 may be provided in the hole H provided in the adjacent black matrix 410. For example, a first color filter 421 may be disposed in a first hole H1, a second color filter 422 may be disposed in a second hole H2, and a third color filter 423 may be disposed in a third hole H3. For example, the first color filter 421 may be a red color filter, the second color filter 422 may be a green color filter, and the third color filter 423 may be a blue color filter. The color filter 420 may be formed to fill the hole H. Due to a process margin, the color filter 420 may be formed on an upper surface of the black matrix 410 to surround an end of the black matrix 410. However, embodiments are not limited thereto. For example, the color filter 420 may be formed to fill only the hole H.

When the color filter 420 is directly formed on the organic light-emitting device 260, a high temperature can affect the organic light-emitting device 260. Thus, a low temperature curing color filter may be used. Because the black matrix 410 may include the metal layer, deformation may not be easy. Therefore, if the color filter 420 is formed in the hole H provided in the black matrix 410, the black matrix 410 may act as a frame of the color filter 420. Due to a dissolution rate difference between a surface receiving much light and a bottom receiving relatively less light, the color filter may not have the reverse taper structure.

Moreover, in an organic light-emitting display device according to an embodiment of the present disclosure, the hole H may be provided to extend the second inorganic layer 303 of the encapsulation layer 300 disposed on a lower surface of the black matrix 410. Thus, when the color filter 420 is formed in the hole H, a lower portion of the color filter 420 may be hung on the lower surface of the black matrix 410, e.g., in a hook shape. Accordingly, the color filter 420 may be disposed to contact the lower surface of the black matrix 410. Thus, the color filter 420 may not be detached by an external force, thereby reducing or preventing the process stability and product reliability of the organic light-emitting display device from being reduced.

The filter planarization layer 430 may be disposed to cover the black matrix 410 and the color filter 420. The filter planarization layer 430 may planarize a step height caused by the color filter 420 on the black matrix 410. The filter planarization layer 430 may be formed, e.g., of an organic layer, such as acryl resin, epoxy resin, phenolic resin, polyamide resin, polyimide resin, and/or the like.

In an organic light-emitting display device according to an embodiment of the present disclosure, because the black matrix 410 may include the metal layer, deformation may not be easily made. Thus, the black matrix 410 may act as a frame of the color filter 420. Accordingly, due to a dissolution rate difference between a surface receiving more light and a bottom receiving relatively less light, the color filter 420 may not have a reverse taper structure. Also, in an organic light-emitting display device according to an embodiment of the present disclosure, because the color filter 420 may be disposed to contact the lower surface of the black matrix 410, the color filter 420 may not be detached by an external force, thereby reducing or preventing the process stability and product reliability of the organic light-emitting display device from being reduced. The substrate 100, the pixel array layer 200, the encapsulation layer 300, and the color filter layer 400 may configure an organic light-emitting display panel.

Figure 3:
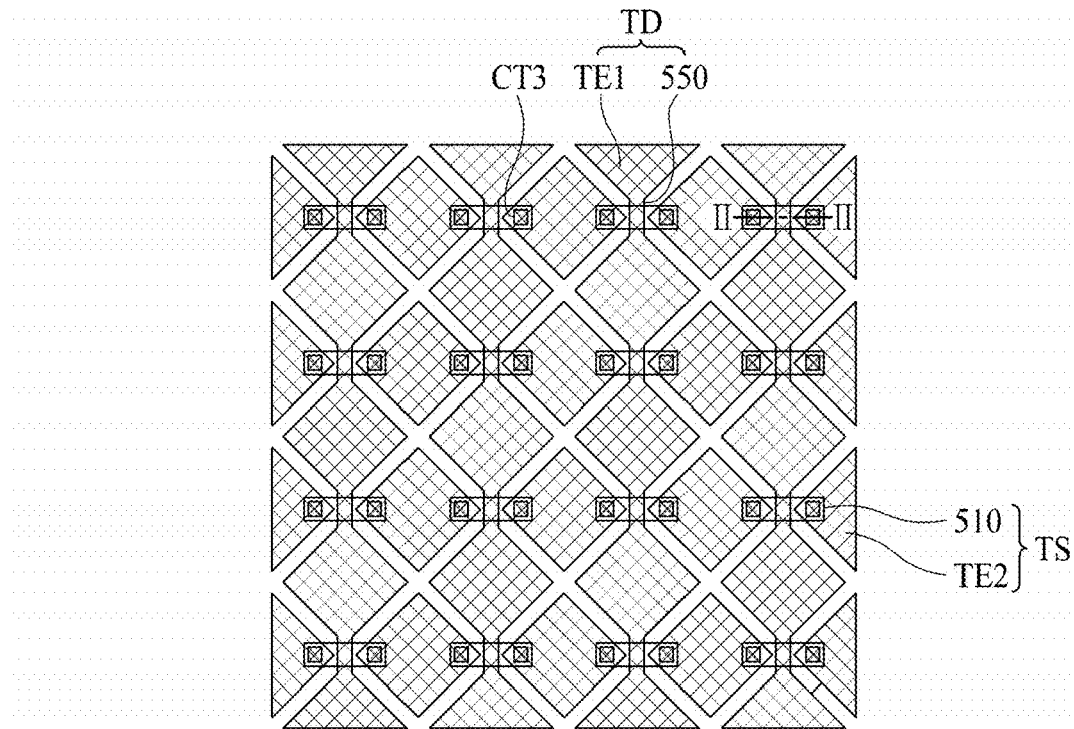
FIG. 3 is a plan view illustrating a touch sensing layer of an organic light-emitting display device according to an embodiment of the present disclosure.

FIG. 3 is a plan view illustrating a touch sensing layer of an organic light-emitting display device according to an embodiment of the present disclosure.

With reference to the FIG. 3 example, a touch sensing layer 500 according to an embodiment of the present disclosure may include a touch driving line TD and a touch sensing line TS which are provided on the color filter layer 400. The touch driving line TD may include a plurality of first touch electrodes TE1 and a first bridge 550 that may electrically connect the plurality of first touch electrodes TE1.

The plurality of first touch electrodes TE1 may be arranged along a first direction, and may be spaced apart from each other by a particular interval. Each of the plurality of first touch electrodes TE1 may have a rectangular shape, an octagonal shape, a circular shape, a lozenge shape, or the like. Each of the plurality of first touch electrodes TE1 may be electrically connected to an adjacent first touch electrode TE1, e.g., through the first bridge 550. The first bridge 550 may be electrically connected to the first touch electrodes TE1 without a separate contact hole.

The touch sensing line TS may include a plurality of second touch electrodes TE2 and a second bridge 510 that may electrically connect the plurality of second touch electrodes TE2. The plurality of second touch electrodes TE2 may be arranged along a second direction vertical to the first direction, and may be spaced apart from each other by a particular interval. Each of the plurality of second touch electrodes TE2 may have a rectangular shape, an octagonal shape, a circular shape, a lozenge shape, or the like. Each of the plurality of second touch electrodes TE2 may be electrically connected to an adjacent second touch electrode TE2, e.g., through the second bridge 510. The second bridge 510 may be electrically connected to the second touch electrodes TE2, e.g., through a contact hole CT3.

As described above, the touch sensing line TS may intersect the touch driving line TD with the touch insulation layer 520 therebetween. Thus, a mutual capacitor having a mutual capacitance may be provided in an intersection portion of the touch sensing line TS and the touch driving line TD. Accordingly, the mutual capacitor may be charged with an electric charge by a touch driving pulse supplied through the touch driving line TD, and may discharge the charged electric charge to the touch sensing line TS, thereby acting as a touch sensor.

Figure 4:
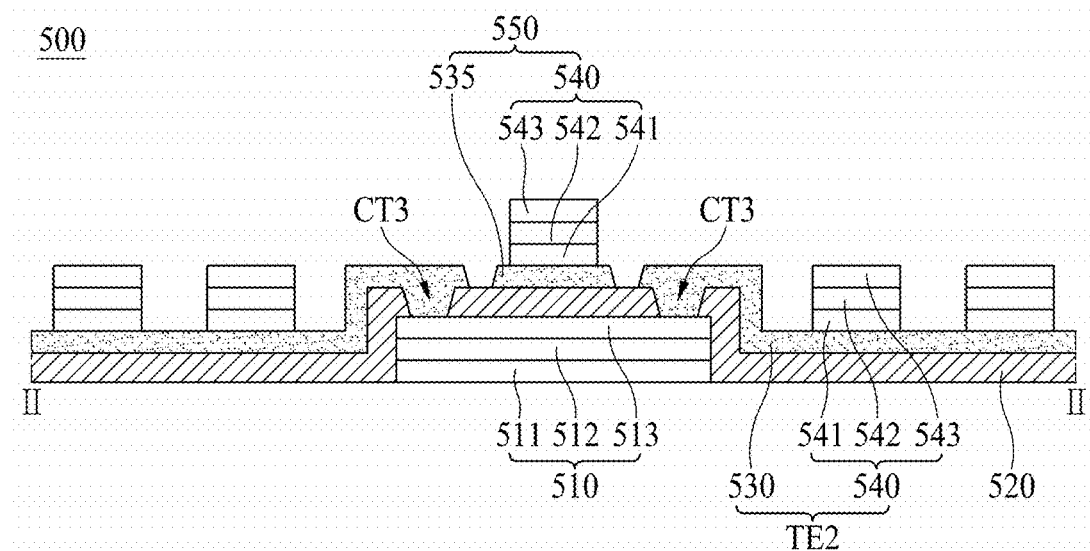
FIG. 4 is a cross-sectional view taken along line II-II of FIG. 3 and illustrates a touch sensing layer of an organic light-emitting display device according to an embodiment of the present disclosure.

FIG. 4 is a cross-sectional view taken along line II-II of FIG. 3 and illustrates a touch sensing layer of an organic light-emitting display device according to an embodiment of the present disclosure.

With reference to the FIG. 4 example, a touch sensing layer 500 of an organic light-emitting display device according to an embodiment of the present disclosure may include a second bridge 510, a touch insulation layer 520, a plurality of transparent conductive layers 530 and 535, a mesh metal layer 540, and a first bridge 550. The second bridge 510 may be a bridge electrode that may electrically connect adjacent second touch electrodes TE2. The second bridge 510 may be provided on a layer different from the second touch electrodes TE2, and may electrically connect two adjacent second touch electrodes TE2 that may be separated from each other by the first bridge 550. For example, the first bridge 550 and the second bridge 510 may be electrically disconnected from each other, e.g., by the touch insulation layer 520.

The second bridge 510 may be electrically connected to the second touch electrodes TE2, e.g., through a contact hole CT3. Foe example, the second bridge 510 may be electrically connected to the transparent conductive layer 530 through the contact hole CT3 that may pass through the touch insulation layer 520. The second bridge 510 may be disposed to overlap a bank 270, thereby reducing or preventing an aperture ratio from being damaged by the second bridge 510.

The second bridge 510 may be directly provided on an upper surface of a color filter layer 400, and may include at least three metal layers. The second bridge 510 may include a reflective layer 511, a light path change layer 512, and a semi-transmissive layer 513.

The reflective layer 511 may be directly disposed on the upper surface of the color filter layer 400. The reflective layer 511 may include, for example, MoTi or Mo. Because MoTi is high in adhesive force, MoTi may reduce or prevent the reflective layer 511 from being stripped from the encapsulation layer 300, and a reflectance may be low.

The light path change layer 512 may be disposed on the reflective layer 511. The light path change layer 512 may include, for example, ITO or IZO. The light path change layer 512 may include, for example, $SiO_2$, $SiN_x$, $Al_2O_3$, and/or the like. The light path change layer 512 may be disposed between the reflective layer 511 and the semi-transmissive layer 513, e.g., to cause destructive interference based on a light path difference. For example, some of external light incident on the semi-transmissive layer 513 may be reflected as first reflection light by the light path change layer 512, and the other light of the external light that may pass through the light path change layer 512 without being reflected by the light path change layer 512 may be reflected as second reflection light to the reflective layer 511 via the light path change layer 512. However, the first and second reflection lights may be dissipated by the destructive interference. As such, a thickness of the light path change layer 512 may be set for the first and second reflection lights to be dissipated by destructive interference caused by a phase difference.

Therefore, in the second bridge 510, destructive interference may occur in external light incident by the light path change layer 512. As such, reflectance may be reduced. Accordingly, an organic light-emitting display device according to an embodiment of the present disclosure may reduce or prevent image visibility from being reduced at an outdoor place without a polarizer required by the related art, thereby enhancing image quality.

The semi-transmissive layer 513 may be disposed on the light path change layer 512. The semi-transmissive layer 513 may include, for example, MoTi or Mo. The semi-transmissive layer 513 may be formed of the same material as that of the reflective layer 511. For example, the semi-transmissive layer 513 may be thinner than that of the reflective layer 511. Thus, the semi-transmissive layer 513 may semi-transmit external light incident thereon. A total deposition thickness of the second bridge 510 may be in a range of, e.g., 500 Å~2000 Å, based on a reflectance.

The touch insulation layer 520 may be provided on the color filter layer 400 to cover the second bridge 510. The touch insulation layer 520 may be formed of an organic material or an inorganic material. If the touch insulation layer 520 is formed of the organic material, the touch insulation layer 520 may be provided through a coating process of coating the organic material on the color filter layer 400 and a curing process of curing the coated organic material at a temperature of 100° (degrees C.) or less. If the touch insulation layer 520 is formed of the inorganic material, the touch insulation layer 520 may be formed of the inorganic material deposited on the encapsulation layer 300, e.g., through a low temperature chemical deposition process and a cleaning process which may be alternately performed twice or more. Subsequently, the touch insulation layer 520 may be patterned, e.g., through a photolithography process and an etching process. Thus, the contact hole CT3 may be formed.

The first bridge 550, the first touch electrodes TE1, and the second touch electrodes TE2 may be directly provided on an upper surface of the touch insulation layer 520. The first bridge 550 may overlap the second bridge 510. The first bridge 550 and the first and second touch electrodes TE1 and TE2 may include the transparent conductive layers 530 and 535 and the mesh metal layer 540.

The transparent conductive layers 530 and 535 may be disposed on the touch insulation layer 520. The transparent conductive layer 530 may be electrically connected to the second bridge 510 through the contact hole CT3 passing through the touch insulation layer 520.

The transparent conductive layers 530 and 535 may each include an amorphous transparent conductive material, for example, amorphous ITO. For example, to reduce, prevent, or minimize a damage of the pixel array layer 200 caused by a process temperature for forming the transparent conductive layers 530 and 535, the transparent conductive layers 530 and 535 may be formed of the amorphous transparent conductive material through a low temperature deposition process using a process temperature of 100° (degrees) C. or less. That is, when the transparent conductive layers 530 and 535 are formed of a crystalline transparent conductive material, the pixel array layer 200 may be damaged by a high temperature thermal treatment process that may be performed for securing a low resistance value. Therefore, the transparent conductive layers 530 and 535 may be formed of the amorphous transparent conductive material through a low temperature metal deposition process.

The mesh metal layer 540 may be disposed on the transparent conductive layers 530 and 535. The mesh metal layer 540 may include at least three metal layers. The mesh metal layer 540 may include a reflective layer 541, a light path change layer 542, and a semi-transmissive layer 543.

The reflective layer 541 may be provided on the transparent conductive layer 530. The reflective layer 541 may include, for example, MoTi or Mo. MoTi is high in adhesive force and is low in reflectance.

The light path change layer 542 may be disposed on the reflective layer 541. The light path change layer 542 may include, for example, ITO or IZO. The light path change layer 542 may include, for example, $SiO_2$, $SiN_x$, $Al_2O_3$, and/or the like. The light path change layer 542 may be disposed between the reflective layer 541 and the semi-transmissive layer 543, e.g., to cause destructive interference based on a light path difference. Therefore, in the mesh metal layer 540, destructive interference may occur in external light incident by the light path change layer 542. Thus, reflectance may be reduced. Accordingly, an organic light-emitting display device according to an embodiment of the present disclosure may reduce or prevent image visibility from being reduced at an outdoor place without the polarizer of the related art, thereby enhancing image quality.

The semi-transmissive layer 543 may be disposed on the light path change layer 542. The semi-transmissive layer 543 may include, for example, MoTi or Mo. The semi-transmissive layer 543 may be formed of the same material as that of the reflective layer 541. For example, the semi-transmissive layer 543 may be thinner than that of the reflective layer 541. Thus, the semi-transmissive layer 543 may semi-transmit external light incident thereon.

The mesh metal layer 540, the first bridge 550, and the plurality of first and second touch electrode TE1 and TE2 including the mesh metal layer 540 may have a reflectance of, e.g., about 10% with respect to external light incident thereon when a thickness is 500 Å or more. Accordingly, using a low reflection metal layer stacking structure, an organic light-emitting display device according to an embodiment of the present disclosure may reduce or prevent reflection of external light without a polarizer, thereby reducing the manufacturing cost, reducing or preventing the loss of luminance caused by the polarizer, and enhancing image quality.

In an organic light-emitting display device according to an embodiment of the present disclosure, the touch insulation layer 520 and the first and second touch electrodes TE1 and TE2 may be directly disposed on the upper surface of the filter planarization layer 430 of the color filter layer 400. Accordingly, in comparison with the related art organic light-emitting display device, in which a touch screen is adhered to the organic light-emitting display device by an adhesive, according to an embodiment, an adhesive process may be unnecessary. Thus, a manufacturing process may be simplified, and the manufacturing cost may be reduced.

Figure 5:
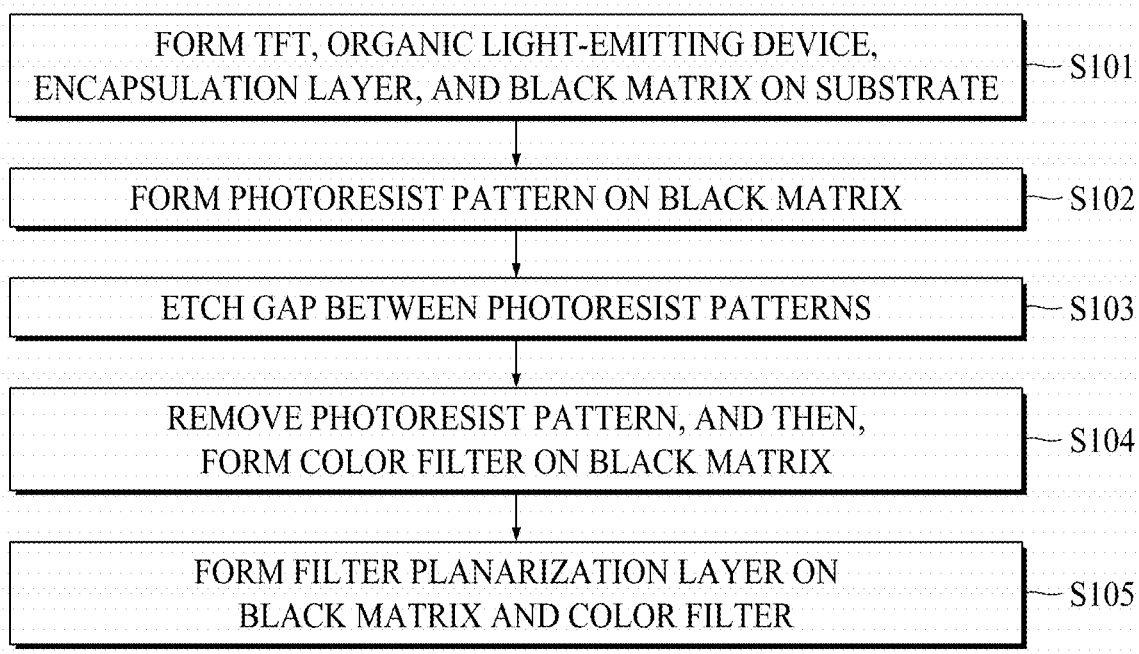
FIG. 5 is a flowchart illustrating a method of manufacturing an organic light-emitting display device according to an embodiment of the present disclosure.

FIG. 5 is a flowchart illustrating a method of manufacturing an organic light-emitting display device according to an embodiment of the present disclosure. FIGS. 6A to 6E are cross-sectional views taken along line I-I of FIG. 1 for describing a method of manufacturing an organic light-emitting display device according to an embodiment of the present disclosure. FIG. 7 is a photograph showing a process of FIG. 6C and shows a cross-sectional surface of each of an encapsulation layer and a color filter layer of an organic light-emitting display device according to an embodiment of the present disclosure.

FIGS. 6A to 6E relate to a method of manufacturing the organic light-emitting display device illustrated in FIG. 2. Thus, like reference numerals refer to like elements. Hereinafter, a method of manufacturing an organic light-emitting display device according to an embodiment of the present disclosure will be described below in detail with reference to FIGS. 5 and 6A to 6E.

Figure 6A:
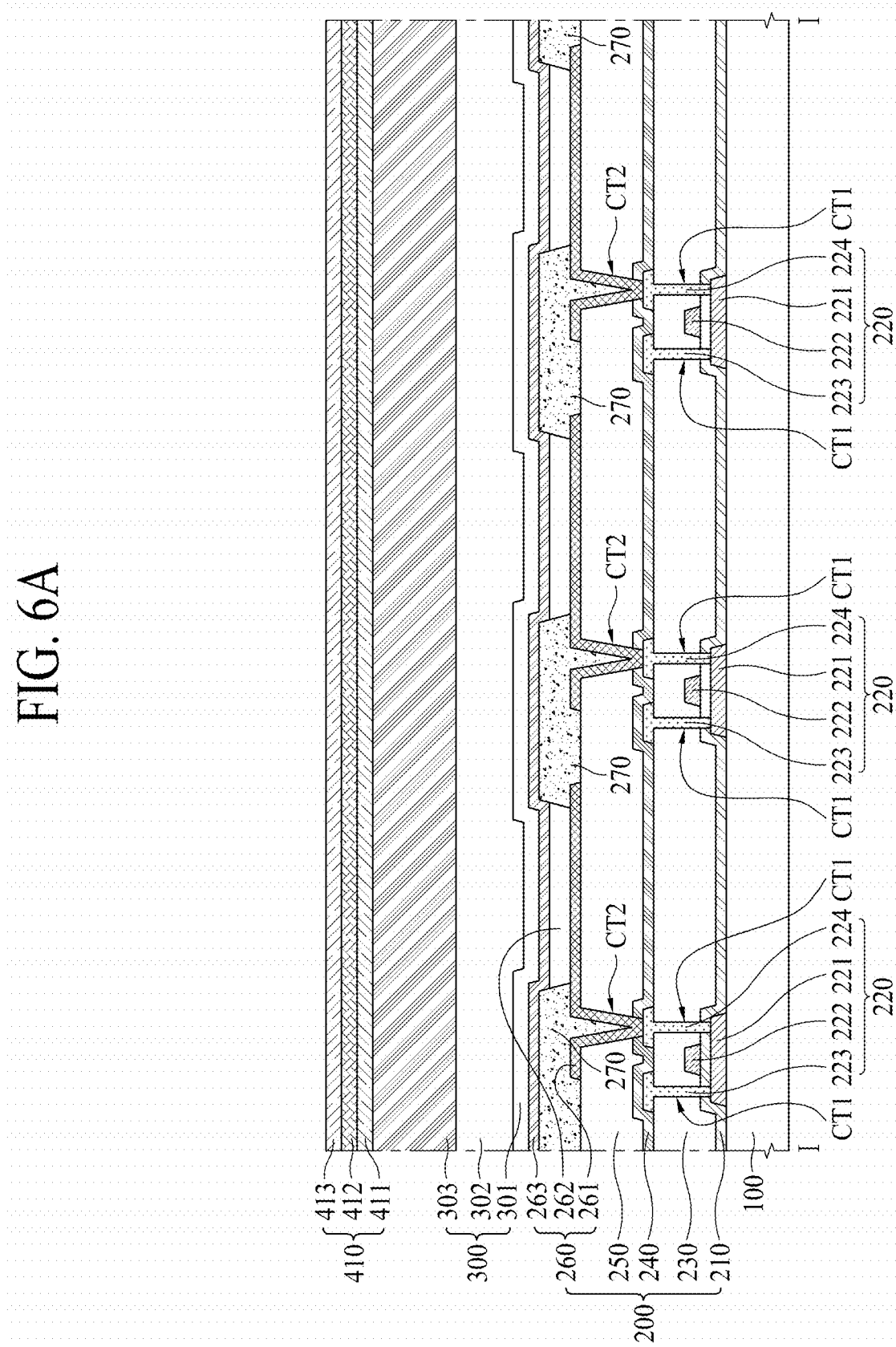
Figure 7:
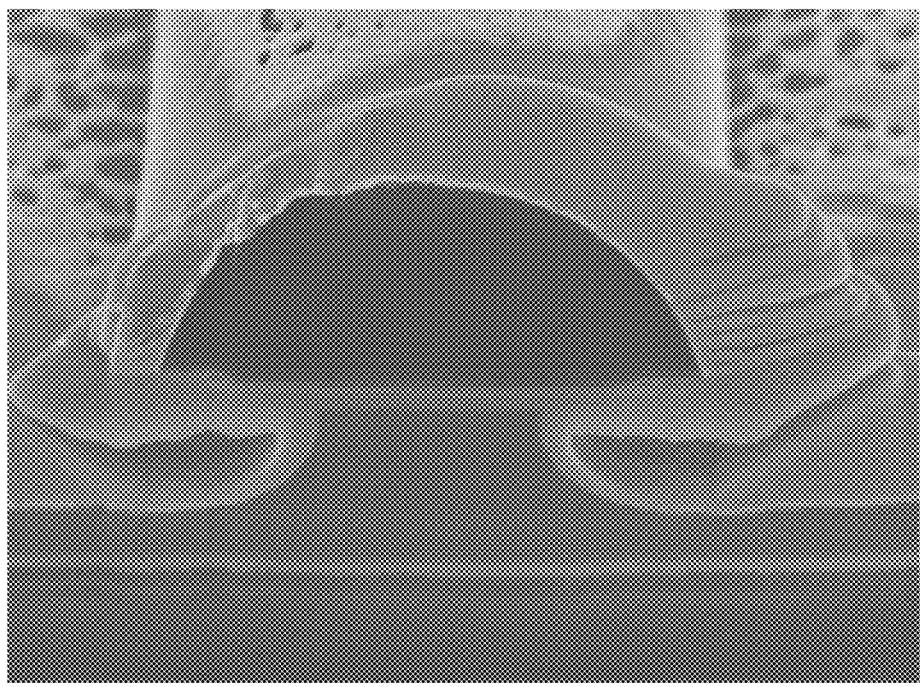
FIG. 7 is a photograph showing a process of FIG. 6C and shows a cross-sectional surface of each of an encapsulation layer and a color filter layer of an organic light-emitting display device according to an embodiment of the present disclosure.

In operation S101 of FIG. 5 and in the FIG. 6A example, a TFT 220, an organic light-emitting device 260, an encapsulation layer 300, and a black matrix 410 may be formed on a substrate 100. For example, the TFT 220 may be formed on a buffer layer. The buffer layer may protect the TFT 220 and the organic light-emitting device 260 from water penetrating through the substrate 100 that may be vulnerable to penetration of water. The buffer layer may include a plurality of inorganic layers that may be alternately stacked. For example, the buffer layer may be formed, e.g., of a multilayer in which one or more inorganic layers, for example, of silicon oxide ($SiO_x$), silicon nitride ($SiN_x$), and SiON may be alternately stacked. The buffer layer may be formed, for example, using a chemical vapor deposition (CVD) process.

Subsequently, an active layer 221 of the TFT 220 may be formed on the buffer layer. In detail, an active metal layer may be formed all over the buffer layer using a sputtering process, a metal organic chemical vapor (MOCVD) process, and/or the like. Subsequently, the active layer 221 may be formed by patterning the active metal layer through a mask process using a photoresist pattern. The active layer 221 may be formed of a silicon-based semiconductor material, an oxide-based semiconductor material, and/or the like.

Subsequently, a gate insulation layer 210 may be formed on the active layer 221. The gate insulation layer 220 may be formed, e.g., of an inorganic layer, for example, silicon oxide ($SiO_x$), silicon nitride ($SiN_x$), or a multilayer thereof.

Subsequently, a gate electrode 222 of the TFT 220 may be formed on the gate insulation layer 210. For example, a first metal layer may be formed all over the gate insulation layer 210, e.g., using a sputtering process, an MOCVD process, and/or the like. Subsequently, the gate electrode 222 may be formed, e.g., by patterning the first metal layer through a mask process using a photoresist pattern. The gate electrode 222 may be formed, for example, of a single layer or a multilayer, which may include one or more of: molybdenum (Mo), aluminum (Al), chromium (Cr), gold (Au), titanium (Ti), nickel (Ni), neodymium (Nd), and copper (Cu), and an alloy thereof.

Subsequently, an interlayer dielectric 230 may be formed on the gate electrode 222. The interlayer dielectric 230 may be formed, e.g., of an inorganic layer, for example, $SiO_x$, $SiN_x$, or a multilayer thereof. Subsequently, a plurality of contact holes CT1 may be formed to pass through the gate insulation layer 210 and the interlayer dielectric 230 to expose the active layer 221.

Subsequently, a source electrode 223 and a drain electrode 224 of the TFT 220 may be formed on the interlayer dielectric 230. For example, a second metal layer may be formed all over the interlayer dielectric 230, e.g., using a sputtering process, an MOCVD process, and/or the like. Subsequently, the source electrode 223 and the drain electrode 224 may be formed, for example, by patterning the second metal layer through a mask process using a photoresist pattern. Each of the source electrode 223 and the drain electrode 224 may contact the active layer 221 through a contact hole CT1 that may pass through the gate insulation layer 210 and the interlayer dielectric 230. The source electrode 223 and the drain electrode 224 may each be formed of a single layer or a multilayer, which may include one or more of: Mo, Al, Cr, Au, Ti, Ni, Nd, and Cu, and an alloy thereof.

Subsequently, a passivation layer 240 may be formed on the source electrode 223 and the drain electrode 224 of the TFT 220. The passivation layer 240 may be formed of an inorganic layer, for example, $SiO_x$, $SiN_x$, or a multilayer thereof. The passivation layer 240 may be formed, e.g., using a CVD process.

Subsequently, a pixel planarization layer 250 for planarizing a step height caused by the TFT 220 may be formed on the passivation layer 240. The pixel planarization layer 250 may be formed of an organic layer, such as acryl resin, epoxy resin, phenolic resin, polyamide resin, polyimide resin, and/or the like.

Subsequently, a first electrode 261 of the organic light-emitting device 260 may be formed on the pixel planarization layer 250. For example, a third metal layer may be formed all over the pixel planarization layer 250, e.g., using a sputtering process, an MOCVD process, and/or the like. Subsequently, the first electrode 261 may be formed, e.g., by patterning the third metal layer through a mask process using a photoresist pattern. The first electrode 261 may be connected to the drain electrode 224 of the TFT 220 through a contact hole CT2 that may pass through the passivation layer 240 and the pixel planarization layer 250. The first electrode 261 may be formed of a conductive material, which may be high in reflectance, such as a stacked structure (Ti/Al/Ti) of Al and Ti, a stacked structure (ITO/Al/ITO) of Al and indium tin oxide (ITO), an APC alloy, a stacked structure (ITO/APC/ITO) of an APC alloy and ITO, and/or the like. Embodiments are not limited to the above examples.

Subsequently, a bank 270 may be formed on the pixel planarization layer 250 to cover an edge of the first electrode 261, for dividing a plurality of pixels P. The bank 270 may be formed of an organic layer, such as acryl resin, epoxy resin, phenolic resin, polyamide resin, polyimide resin, and/or the like.

Subsequently, an organic light-emitting layer 262 may be formed on the first electrode 261 and the bank 270 in a deposition process or a solution process. The organic light-emitting layer 262 may be a common layer that may be formed in the pixels P in common. For example, the organic light-emitting layer 262 may be a white light-emitting layer that may emit white light.

If the organic light-emitting layer 262 is the white light-emitting layer, the organic light-emitting layer 262 may be formed in a tandem structure of two or more stacks. Each of the stacks may include a hole transporting layer, at least one light-emitting layer, and an electron transporting layer.

Moreover, a charge generating layer may be formed between the stacks. The charge generating layer may include an n-type charge generating layer, disposed adjacent to a lower stack, and a p-type charge generating layer that may be formed on the n-type charge generating layer and may be disposed adjacent to an upper stack. The n-type charge generating layer may inject an electron into the lower stack, and the p-type charge generating layer may inject a hole into the upper stack. The n-type charge generating layer may be formed of an organic layer which may be doped, e.g., with alkali metal, such as lithium (Li), sodium (Na), potassium (K), or cesium (Cs), or with an alkali earth metal, such as magnesium (Mg), strontium (Sr), barium (Ba), or radium (Ra). Embodiments are not limited thereto. The p-type charge generating layer may be formed by doping a dopant on an organic material having an ability to transport holes.

Subsequently, a second electrode 263 may be formed on the organic light-emitting layer 262. The second electrode 263 may be a common layer that may be formed in the pixels P in common. The second electrode 263 may be formed of a transparent conductive material (TCO), such as ITO or IZO, capable of transmitting light, or a semi-transmissive conductive material, such as Mg, Ag, or an alloy of Mg and Ag. The second electrode 263 may be formed, e.g., through a physical vapor deposition (PVD) process, such as a sputtering process. A capping layer may be formed on the second electrode 263.

Subsequently, an encapsulation layer 300 may be formed on the second electrode 263. The encapsulation layer 300 reduces or prevents oxygen or water from penetrating into the organic light-emitting layer 262 and the second electrode 263. To this end, the encapsulation layer 300 may include at least one inorganic layer and at least one organic layer.

For example, the encapsulation layer 300 may include a first inorganic layer 301, an organic layer 302, and a second inorganic layer 303. For example, the first inorganic layer 301 may be formed to cover the second electrode 263. The organic layer 302 may be formed to cover the first inorganic layer 301. To reduce or prevent particles from penetrating into the organic light-emitting layer 262 and the second electrode 263 via the first inorganic layer 301, the organic layer 302 may be formed to have a sufficient thickness in consideration of reducing or preventing the penetration of the particles. The second inorganic layer 303 may be formed to cover the organic layer 302.

Each of the first and second inorganic layers 301 and 303 may be formed, for example, of one or more of: silicon nitride, aluminum nitride, zirconium nitride, titanium nitride, hafnium nitride, tantalum nitride, silicon oxide, aluminum oxide, titanium oxide, and/or the like. The organic layer 302 may be formed, e.g., of an organic layer, such as acryl resin, epoxy resin, phenolic resin, polyamide resin, polyimide resin, and/or the like. Subsequently, a black matrix 410 may be formed on the encapsulation layer 300.

For example, a first matrix metal layer 411, an inorganic layer 412, and a second matrix metal layer 413 may be sequentially formed on the second inorganic layer 303 of the encapsulation layer 300. For example, the first matrix metal layer 411, the inorganic layer 412, and the second matrix metal layer 413 may be formed all over the encapsulation layer 300, e.g., using a sputtering process, an MOCVD process, and/or the like.

Figure 6B:
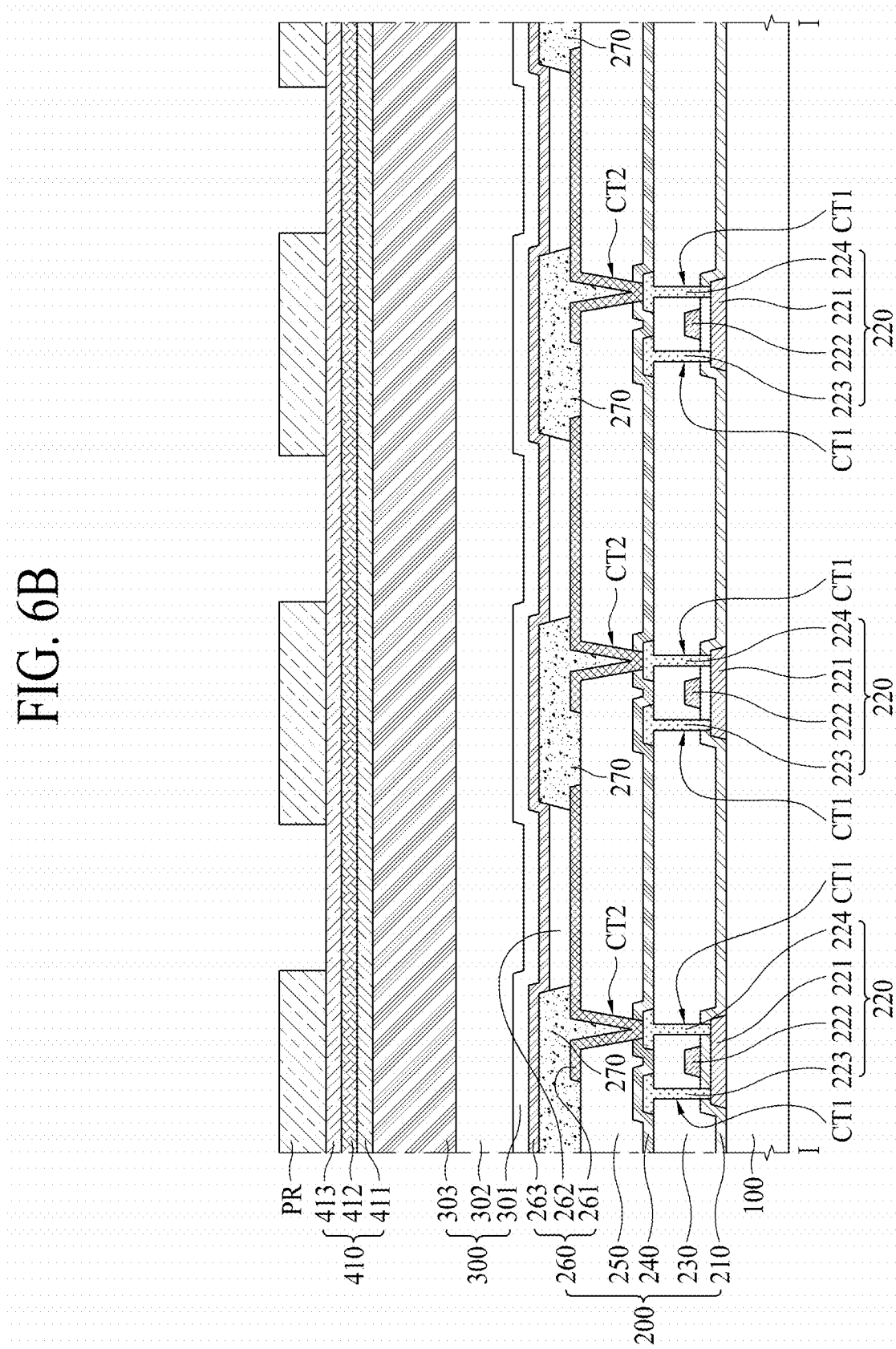

In operation S102 of FIG. 5 and in the FIG. 6B example, a photoresist pattern PR may be formed on the black matrix 410. The black matrix 410 may overlap the bank 270.

Figure 6C:
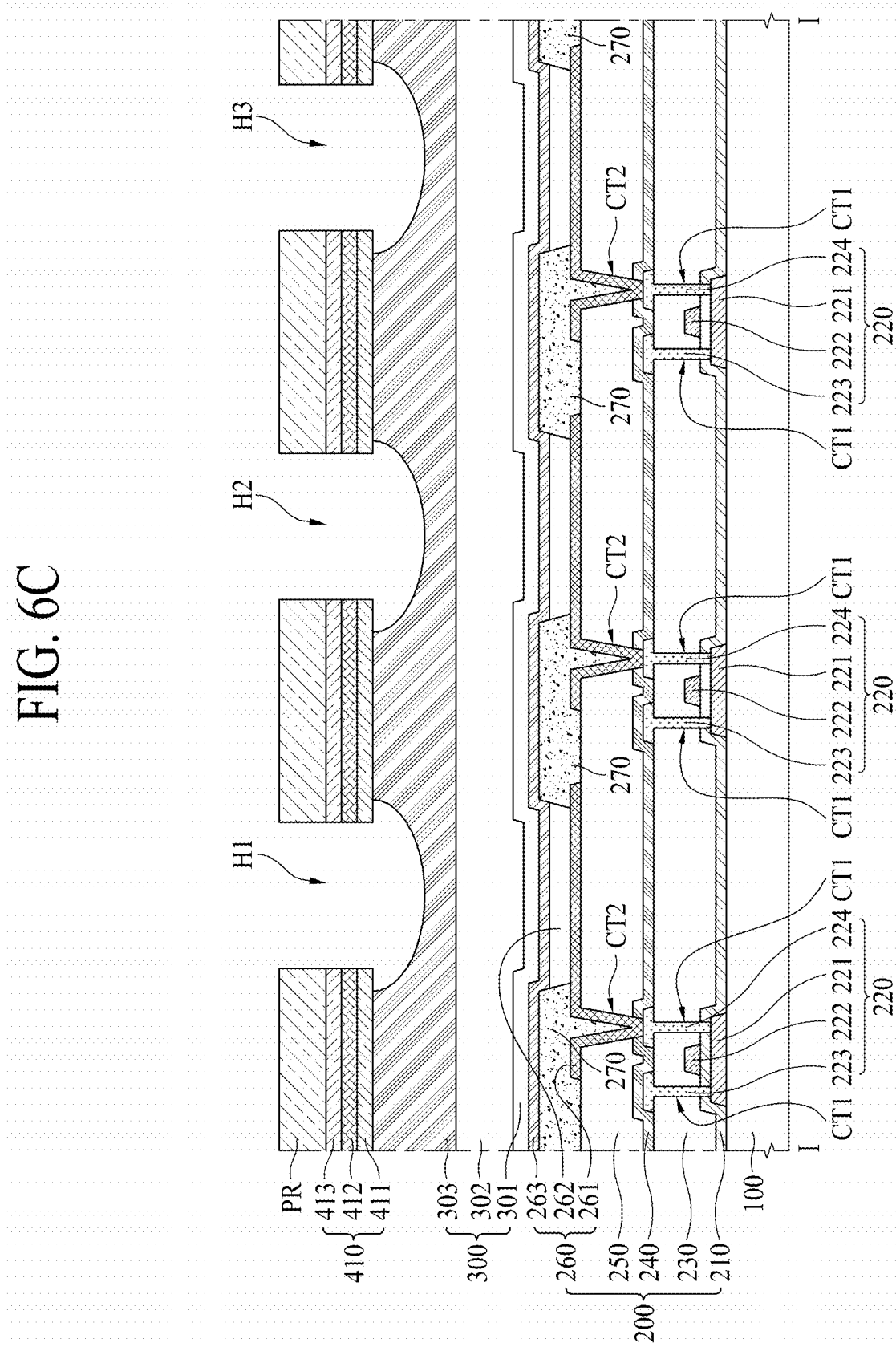

In operation S103 of FIG. 5 and in the examples of FIGS. 6C and 7, a hole H may be formed in the black matrix 410 and the encapsulation layer 300, e.g., by etching a gap between adjacent photoresist patterns PR. Foe example, a first hole H1, a second hole H2, and a third hole H3 may be formed in the black matrix 410 and on the second inorganic layer 303 to correspond to the organic light-emitting layer 262. A portion of the black matrix 410 uncovered by the photoresist pattern PR may be removed through an etching process. If the etching process is continuously performed, even after a portion of the black matrix 410 corresponding to a gap between adjacent photoresist patterns PR is removed, over-etching may be made. Thus, a portion of the second inorganic layer 303 may be removed. Therefore, the hole H may be formed to extend to a lower surface of the black matrix 410.

Figure 6D:
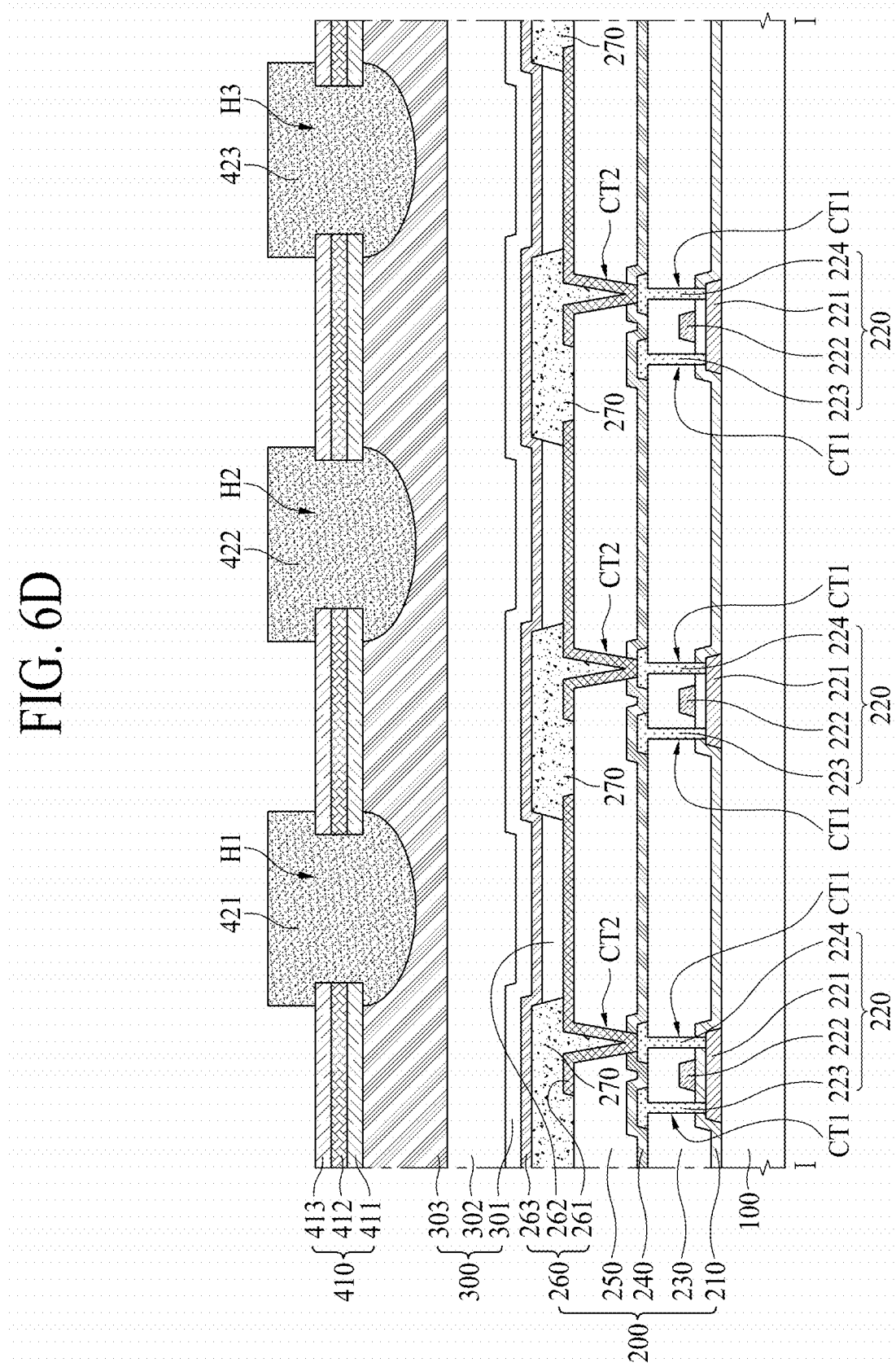

In operation S104 of FIG. 5 and in the FIG. 6D example, the photoresist pattern PR may be removed. Then, a color filter 420 may be formed in the hole H provided in the black matrix 410.

For example, a first color filter 421 may be formed in the first hole H1, a second color filter 422 may be formed in the second hole H2, and a third color filter 423 may be formed in the third hole H3. For example, the first color filter 421 may be a red color filter, the second color filter 422 may be a green color filter, and the third color filter 423 may be a blue color filter. An organic material including a red pigment may be coated on the black matrix 410. The first color filter 421 may be formed in the first hole H1, e.g., by performing a photo process.

Subsequently, an organic material including a green pigment may be coated on the black matrix 410. The second color filter 422 may be formed in the second hole H2 by performing a photo process.

Subsequently, an organic material including a blue pigment may be coated on the black matrix 410. The third color filter 423 may be formed in the third hole H3 by performing a photo process.

The color filter 420 may be formed to fill the hole H, and may also be formed on an upper surface of the black matrix 410, but embodiments are not limited thereto. For example, the color filter 420 may be formed to fill only the hole H.

When the color filter 420 is directly formed on the organic light-emitting device 260, a high temperature can affect the organic light-emitting device 260. Thus, a low temperature curing color filter may be used. Because the black matrix 410 of an organic light-emitting display device according to an embodiment of the present disclosure may include the metal layer, deformation is not easily made. Therefore, if the color filter 420 is formed in the hole H provided in the black matrix 410, the black matrix 410 may act as a frame of the color filter 420. Due to a dissolution rate difference between a surface receiving much light and a bottom receiving relatively less light, the color filter may not have the reverse taper structure. Also, in an organic light-emitting display device according to an embodiment of the present disclosure, the hole H may be provided to extend the second inorganic layer 303 of the encapsulation layer 300 disposed on a lower surface of the black matrix 410. Thus, when the color filter 420 is formed in the hole H, a lower portion of the color filter 420 may be hung on the lower surface of the black matrix 410, e.g., in a hook shape. Accordingly, the color filter 420 may be disposed to contact the lower surface of the black matrix 410. Thus, the color filter 420 may not be detached by an external force, thereby reducing or preventing the process stability and product reliability of the organic light-emitting display device from being reduced. Due to a process margin, the color filter 420 may be formed on an upper surface of the black matrix 410 to surround an end of the black matrix 410.

In operation S105 of FIG. 5 and in the FIG. 6E example, a filter planarization layer 430 may be formed on the black matrix 410 and the color filter 420. The filter planarization layer 430 may be formed to cover the black matrix 410 and the color filter 420 for planarizing a step height caused by the color filter 420. The filter planarization layer 430 may be formed of an organic layer, such as acryl resin, epoxy resin, phenolic resin, polyamide resin, polyimide resin, and/or the like.

A process of forming the color filter layer 400 illustrated in the examples of FIGS. 6A to 6E may be a process of forming the color filter layer 400 on the encapsulation layer 300 covering the organic light-emitting device 260. Thus, the process of forming the color filter layer 400 may be a low temperature process which is performed at a temperature of 100° (degrees) C. or less for reducing or preventing the organic light-emitting device 260 from being damaged. Moreover, although it has been described above that the first color filter 421 is the red color filter, the second color filter 422 is the green color filter, and the third color filter 423 is the blue color filter, but embodiments are not limited thereto.

As described above, in an organic light-emitting display device according to an embodiment of the present disclosure, because the black matrix may include the metal layer, deformation is not easily made. Thus, the black matrix may act as the frame of the color filter. Accordingly, due to a dissolution rate difference between a surface receiving more light and a bottom receiving relatively less light, the color filter may not have the reverse taper structure.

Moreover, in an organic light-emitting display device according to an embodiment of the present disclosure, because the color filter may be disposed to contact the lower surface of the black matrix, the color filter may not be detached by an external force, thereby reducing or preventing the process stability and product reliability of the organic light-emitting display device from being reduced.

Moreover, in an organic light-emitting display device according to an embodiment of the present disclosure, by applying the low reflection metal layer stacked structure, reflection of external light may be reduced or prevented without a polarizer, thereby reducing the cost, reducing or preventing luminance from being reduced by the polarizer, and enhancing image quality.

In comparison with the related art organic light-emitting display device in which a touch screen is adhered to an organic light-emitting display device by an adhesive, in an organic light-emitting display device according to an embodiment of the present disclosure, because the touch insulation layer and the first and second touch electrodes may be directly disposed on the color filter layer, an adhering process may not be needed. Thus, a process may be simplified and the cost may be reduced.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display device, comprising:
   a substrate;
   an organic light-emitting device on the substrate;
   an encapsulation layer on the substrate and the organic light-emitting device, the encapsulation layer covering the organic light-emitting device, the encapsulation layer comprising:
   a first inorganic layer disposed on an upper surface of the organic light emitting device;
   an organic layer disposed on the first inorganic layer;
   a second inorganic layer disposed on the organic layer; and
   an encapsulation hole;
   a black matrix covering the encapsulation layer, the black matrix comprising a black matrix hole over the encapsulation hole; and
   a color filter formed to fill the encapsulation hole and the black matrix hole,
   wherein the second inorganic layer is in contact with the black matrix,
   wherein the encapsulation hole is provided in the second inorganic layer,
   wherein the organic light-emitting device, the encapsulation layer, the black matrix, and the color filter are formed on the same substrate,
   wherein the color filter directly contacts at least a portion of a bottom surface of the black matrix and at least a portion of a top surface of the black matrix in a cross-sectional view, the top surface of the black matrix being above the bottom surface of the black matrix in the cross-sectional view,
   wherein a bottommost surface of the color filter is below a bottommost surface of the black matrix in the cross-sectional view, and a topmost surface of the color filter is above a topmost surface of the black matrix in the cross-sectional view, and
   wherein the color filter covers an entirety of a side surface of the black matrix in the encapsulation hole in the cross-sectional view.

2. The organic light-emitting display device of claim 1, wherein the color filter contacts a lower surface of the black matrix.

3. The organic light-emitting display device of claim 1, wherein the color filter surrounds an end of the black matrix.

4. The organic light-emitting display device of claim 1, wherein the black matrix comprises a plurality of metal layers.

5. The organic light-emitting display device of claim 4, wherein the black matrix comprises:
- a reflective layer on an upper surface of the encapsulation layer;
- a light path change layer on the reflective layer; and
- a semi-transmissive layer on the light path change layer.

6. The organic light-emitting display device of claim 1, further comprising:
- a thin film transistor on the substrate;
- the organic light-emitting device electrically connected to the thin film transistor, the encapsulation layer being directly on an upper surface of the organic light-emitting device; and
- a filter planarization layer covering the black matrix and the color filter.

7. The organic light-emitting display device of claim 6, further comprising a touch sensing layer directly on an upper surface of the filter planarization layer, the touch sensing layer comprising:
- a plurality of first touch electrodes; and
- a plurality of second touch electrodes.

8. The organic light-emitting display device of claim 7, wherein the plurality of first touch electrodes, the plurality of second touch electrodes, and the black matrix each comprise at least three metal layers.

9. The organic light-emitting display device of claim 1, wherein the top surface of the black matrix is the topmost surface of the black matrix.

10. The organic light-emitting display device of claim 1, wherein the bottom surface of the black matrix is the bottommost surface of the black matrix.

* * * * *